United States Patent [19]
Saitou et al.

[11] Patent Number: 5,806,152
[45] Date of Patent: Sep. 15, 1998

[54] COMPLIANT LATCHING FASTENER

[75] Inventors: Kazuhiro Saitou, Cambridge, Mass.; Mark J. Jakiela, Clayton, Mo.

[73] Assignee: Massachusetts Institute of Technology, Cambridge, Mass.

[21] Appl. No.: 749,978

[22] Filed: Nov. 15, 1996

[51] Int. Cl.[6] .......................... H01R 16/627; A41F 1/00
[52] U.S. Cl. .............................. 24/662; 24/664; 24/635; 24/651; 439/352; 439/357
[58] Field of Search .......................... 24/662, 633, 634, 24/635, 651, 664, 648; 439/357, 358, 352, 328

[56] References Cited

U.S. PATENT DOCUMENTS

| | | | |
|---|---|---|---|
| 737,068 | 8/1903 | Briel | 24/635 X |
| 2,816,340 | 12/1957 | Anglada Domenech et al. | 24/664 X |
| 3,216,580 | 11/1965 | Fricker, Jr. | 439/328 X |
| 4,317,263 | 3/1982 | Fohl | 24/635 |
| 4,559,679 | 12/1985 | Downey . | |
| 4,616,953 | 10/1986 | Gomes | 24/662 X |
| 4,709,949 | 12/1987 | Umezawa et al. | 24/662 X |
| 4,803,760 | 2/1989 | Gelula | 24/648 X |
| 5,179,499 | 1/1993 | MacDonald et al. . | |
| 5,295,852 | 3/1994 | Renn et al. | 439/328 |
| 5,322,037 | 6/1994 | Tozawa . | |
| 5,355,562 | 10/1994 | Matoba et al. | 24/664 X |
| 5,359,756 | 11/1994 | Miyauchi et al. | 24/633 X |

FOREIGN PATENT DOCUMENTS

| | | | |
|---|---|---|---|
| 0607576 | 7/1994 | European Pat. Off. . | |
| 2060789 | 6/1972 | Germany | 24/634 |
| 2159023 | 5/1973 | Germany | 439/357 |
| 2915246 | 10/1979 | Germany | 24/651 |
| 0030075 | 1/1990 | Japan | 439/358 |
| 95/05339 | 2/1995 | WIPO . | |

OTHER PUBLICATIONS

Ehrfeld et al., "Fabrication of Microstructures Using the LIGA Process," Proc., IEEE Micro Robots and Teleoperators Workshop., (no page numbering) Hyannis, MA, Nov. 9–11, 1987.

Jebens et al., "Micro Actuators For Aligning Optical Fibers," Proc., IEEE Micro Electro Mechanical Systems Conference, pp. 35–39, Salt Lake City, Utah, Feb. 20–22, 1989.

Cho et al., "Optimum structural design of micromechanical crab-leg flexures with microfabrication constraints," DSC V. 19, ASME Winter Ann. Mtg., pp. 31–49, Dallas, TX, Nov. 25–30, 1990.

Kim et al., "Design, fabrication, and testing of a polysilicon microgripper," DSC V. 19, ASME Winter Ann. Mtg., pp. 99–109, Dallas, TX, Nov. 25–30, 1990.

Han et al., "Micromechanical Velcro," *Journal of Microelectromechanical Systems*, vol. 1, No. 1, pp. 37–43, Mar. 1992.

Donald et al., "The motion of planar, compliantly connected rigid bodies in contact, with applications to automatic fastening," *Int. Jnl. of Robotics Research*, V. 12, No. 4, pp. 307–337, Aug. 1993.

(List continued on next page.)

*Primary Examiner*—Peter M. Cuomo
*Assistant Examiner*—Hanh Tran
*Attorney, Agent, or Firm*—Theresa A. Lober

[57] ABSTRACT

A latching fastener having cocking and triggering mechanisms is provided. The fastener has two flexible fastening latch arms each fixed at a proximal end of the arm and having a free distal end. The two arms are located relative to each other to cooperate in grasping a structure between them. A fastener cocking mechanism is connected to the fastening latch arms for retracting the distal ends of the arms when the cocking mechanism is activated, to thereby produce a latching gap between the distal ends of the arms. A trigger mechanism is located between the fastening latch arms such that a structure guided into the latching gap can activate the trigger, for deactivating the cocking mechanism, which in turn results in closing together of the distal ends of the fastening latch arms, to grasp the structure between them and latch the structure to the fastener. The latching fastener can be fabricated of plastic or other compliant material and is particularly well-suited for fabrication as a silicon microfastener for micro-scale applications.

16 Claims, 7 Drawing Sheets

OTHER PUBLICATIONS

Howell et al., "A Method for the Design of Compliant Mechanisms with Small–length Flexural Pivots," *Transactions of the ASME,* vol. 116, pp. 280–290, Mar. 1994.

Ananthasuresh et al., "A Methodical Approach to the Design of Compliant Micromechanisms," IEEE Solid–State Sensor and Actuator Wkshp., pp. 189–192, Hilton Head, SC, Jun. 13–16, 1994.

Ananthasuresh et al., "Strategies for Systematic Synthesis of Compliant MEMS," DSC vol. 55–2, Dynamic systems and Control: vol. 2, pp. 677–686, ASME, 1994.

Gerner et al., "Micro–Optical Components for Fiber and Integrated Optics realized by the LIGA Technique," Proc., IEEE Microelectromechanical Systems Conf., pp. 328–333, Amsterdam, The Netherlands, Jan. 29, 1995.

Prasad et al., "Design, fabrication, and characterization of single crystal silicon latching snap fasteners for micro assembly," Proc., ASME Int. Mech. Emg. Congress and Expo (IMECE '95), (no page numbering) San Francisco, CA, Nov., 1995.

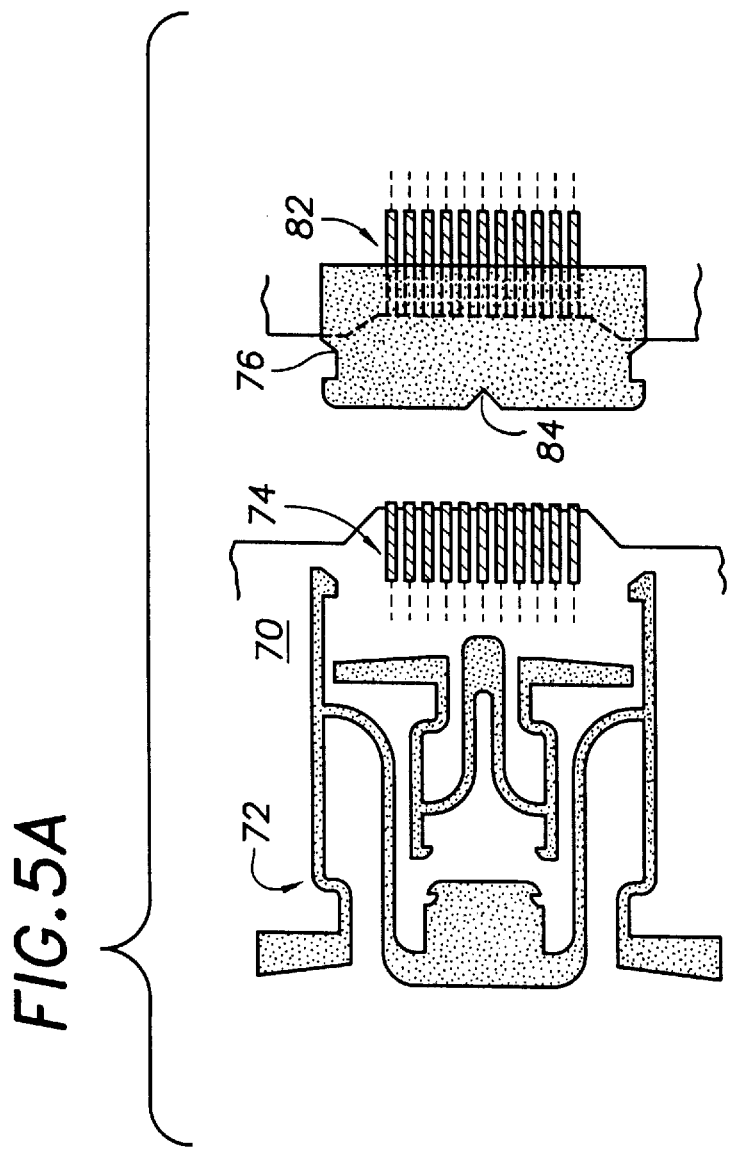

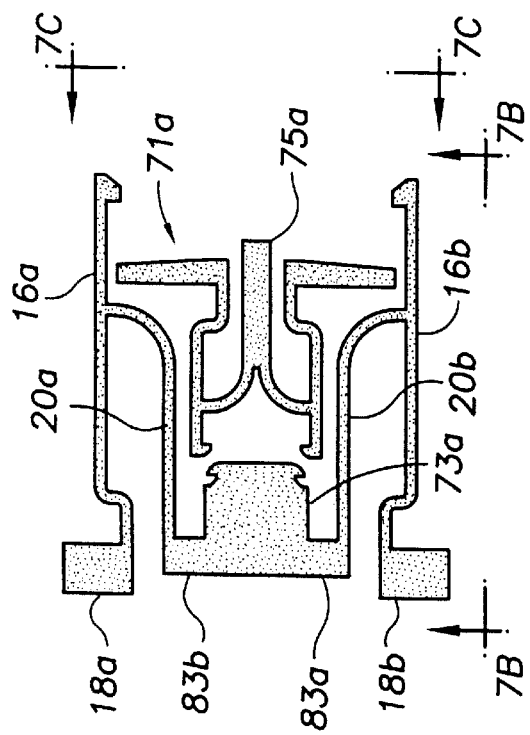
FIG.7A
FIG.7B
FIG.7C

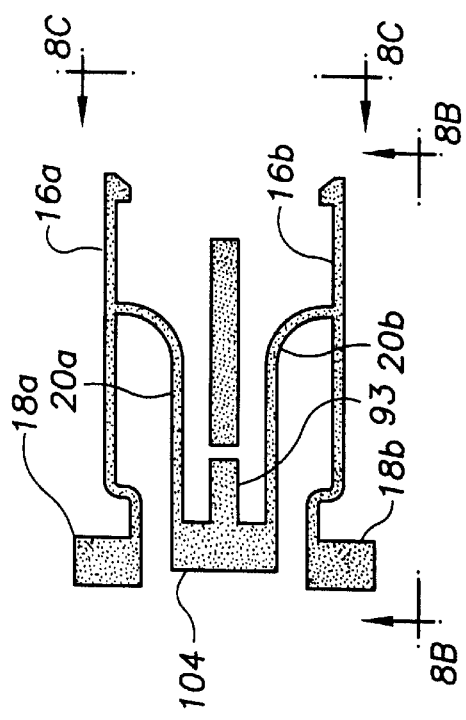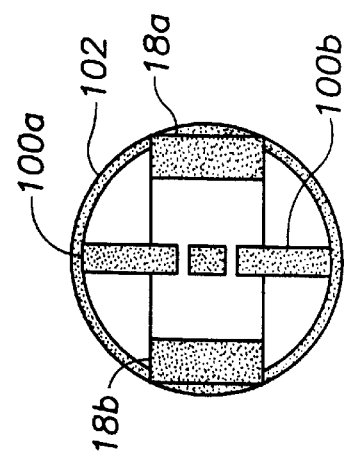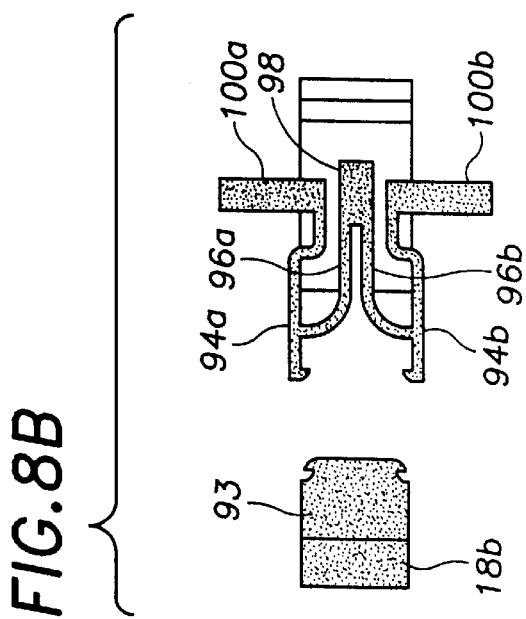
FIG.8A
FIG.8C
FIG.8B

COMPLIANT LATCHING FASTENER

GOVERNMENT RIGHTS IN THE INVENTION

This invention was made with U.S. Government support under National Science Foundation Contract Number DMII-905-8415. The U.S. Government has certain rights in this invention.

BACKGROUND OF THE INVENTION

This invention relates to fastening devices, and more particularly relates to fastener latching configurations.

Fastening devices are employed in a wide range of applications, typically for attaching, linking, securing, or anchoring together two or more independent members to be temporarily or permanently connected by way of such a fastener. Conventionally, a fastener provides two mating members having corresponding geometries for enabling a cooperative fastening action when the two members are brought together. In many fastening applications, precise manual positioning of one mating member relative to the other for effecting this fastening action can be difficult due to, for example, size of the members or motion of the members and their attachments. These conditions can also result in an inability to confirm complete fastening between the mating members, and can inhibit fastening in devices requiring large fastening forces.

SUMMARY OF THE INVENTION

The present invention provides a fastener having a compliant latching mechanism that facilitates accurate fastening action even with relatively inaccurate positioning of latching members. The fastener further provides dual positive latching configurations that confirm both latching and unlatching of the fastener.

Accordingly, the invention provides a latching fastener having cocking and triggering mechanisms. The fastener has two flexible fastening latch arms each fixed at a proximal end of the arm and having a free distal end. The two arms are located relative to each other to cooperate in grasping a structure between them. A fastener cocking mechanism is connected to the fastening latch arms for retracting the distal ends of the arms when the cocking mechanism is activated, to thereby produce a latching gap between the distal ends of the arms. A trigger mechanism is located between the fastening latch arms such that a structure guided into the latching gap can activate the trigger, for deactivating the cocking mechanism, whereby the distal ends of the arms close to grasp the structure between them and latch the structure to the fastener.

The cocking mechanism can be provided, for example, as a cocking element and two cocking latch arms each fixed at a proximal end and having a free distal end, with the two cocking latch arms located relative to each other to cooperate in latching the cocking element between them when the cocking element is pressed between the arms. A compliant fastener beam is connected between the cocking element and to each of the fastening latch arms for retracting the fastening latch arms when the cocking element is latched between the cocking latch arms.

The trigger mechanism can be provided, for example, as a trigger element connected to each of the cocking latch arms by a corresponding compliant trigger beam. This enables retraction of the cocking latch arms to unlatch the cocking element from the between them when the trigger element is pressed by the structure to be fastened, to thereby cause the fastening latch arms to grasp the structure between them.

Each fastening latch arm distal end can be provided with a latch couple for cooperating with a corresponding notch in the structure to be fastened as the fastening latch arms grasp the structure to latch it to the fastener. Similarly, each cocking latch arm distal end can be provided with a latch couple for cooperating with a corresponding notch in the cocking element as the cocking element is latched between the cocking latch arms.

Preferably, the fastening and cocking latch arms, compliant fastener and trigger beams, trigger element, and cocking element all are formed of a compliant material, such as plastic or silicon, here preferably single crystal silicon. The fastening and cocking latch arms, compliant fastener and trigger beams, trigger element, and cocking element all can be formed of corresponding microfabricated arms, beams, and elements suspended over a semiconductor substrate, and such a substrate can further support electronic circuits.

In embodiments provided by the invention, the fastening latch arms are co-planar, and the cocking latch arms, the cocking element, the compliant trigger beams, and the trigger element are together co-planar in a plane that is co-planar, or out-of-plane, e.g., parallel, or orthogonal, to a grasping plane defined by the fastening latch arms.

The dual latching mechanism employed by the fastener of the invention, in cooperation with the compliant connection between the dual latches, enables several performance advantages over more conventional latch fastener configurations. For example, the fastener automatically maintains a retracted cocking condition until triggering, thereby eliminating the need for active control as a free structure to be fastened is guided between the fastening latch arms. The retracted fastening latch arm configuration does not require precise positioning of the free structure to be fastened between the arms but acts to self-position the structure once it is latched. The compliant connections between the cocking and triggering elements enable amplification of applied fastening force by release of potential energy stored during the cocking event. The cocking and triggering elements further enable positive-action confirmation of both latching and unlatching of a free structure.

The fastener of the invention can be employed in a wide range of fastening applications, both at the macro-scale and the micro-scale, for providing secure and effective latching. Other features and advantage of the invention will be apparent from the following description and the accompanying figures, and from the claims.

BRIEF DESCRIPTION OF THE DRAWINGS

FIGS. 5A–B are top-down and side views, respectively, of a microfastener in accordance with the invention adapted as an electro-mechanical micro-connector;

FIGS. 7A–C are a top view, a side view taken at 7B—7B in FIG. 7A, and an end view taken at 7C—7C in FIG. 7A, respectively, of a multi-planar embodiment of the microfastener of the invention; and.

FIGS. 8A–C are a top view, a side view taken at 8B—8B in FIG. 8A, and an end view taken at C–C in FIG. 8A, respectively, of an orthogonal embodiment of the microfastener of the invention.

DETAILED DESCRIPTION OF THE INVENTION

The compliant latching fastener of the invention provides a wide range of design options for enabling cocking and triggering of a grasping action produced by a pair of latch arms. To facilitate understanding of the overall latching action enabled by the invention, a specific embodiment of the fastener will first be described, with examples of the many other embodiments contemplated by the invention then presented.

Figure 1:
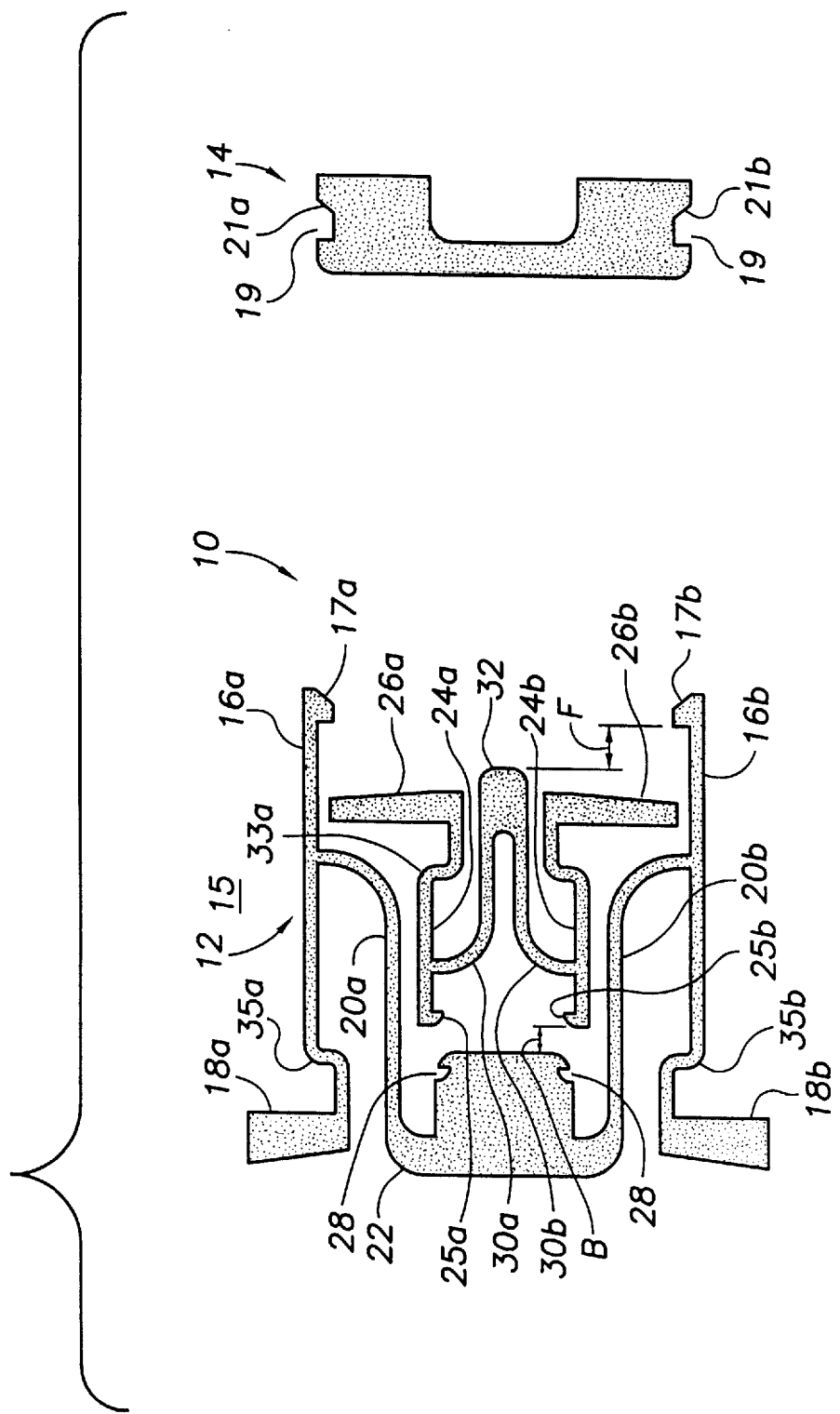
FIG. 1 is a top-down view of the latching fastener of the invention.

Referring then to FIG. 1, there is shown a first embodiment of the compliant latching fastener 10 of the invention. This embodiment employs a planar fastener configuration. As such, the fastener provides an anchored, planar dual latch 12 having compliant flexures for effecting cooperative fastening action between the dual latch and a free member 14 to be latched; "free member" is here meant to refer to any structure not connected to the dual latch, but perhaps connected to some other structure. The dual latch 12 includes fastening latch arms, here embodied as outer latching arms 16a, 16b, each anchored by a corresponding anchor 18a, 18b, at a proximal end of the arms to an underlying substrate 15 and being suspended over the substrate to be moveable in a plane above the substrate. Each arm provides a latch couple 17a, 17b, at its distal end that corresponds to notches 19 in the free member 14 to be latched. At a point along their midspan, each outer latching arm is connected by a corresponding fastener beam, here embodied as an outer compliant beam 20a, 20b, co-planar with the latching arms, to a latch cocking element 22.

This cocking element, which also is free to move in the plane of the arms and beams above the substrate, is configured adjacent to cocking latch arms, here embodied as inner latching arms 24a, 24b; the inner latching arms, like the outer latching arms, are each anchored by a corresponding anchor 26a, 26b, at a proximal end of the arms to the substrate but are moveable in the plane of the arms and beams above the substrate, and each arm provides a latch couple 25a, 25b, at its distal end. These latch couples correspond to notches 28 in the latch cocking element 22. The inner latching arms are in turn connected by corresponding compliant trigger beams, here embodied as inner compliant beams 30a, 30b, to a latch trigger 32 that is co-planar with the other elements and free to move in the common plane above the substrate.

Figure 2A:
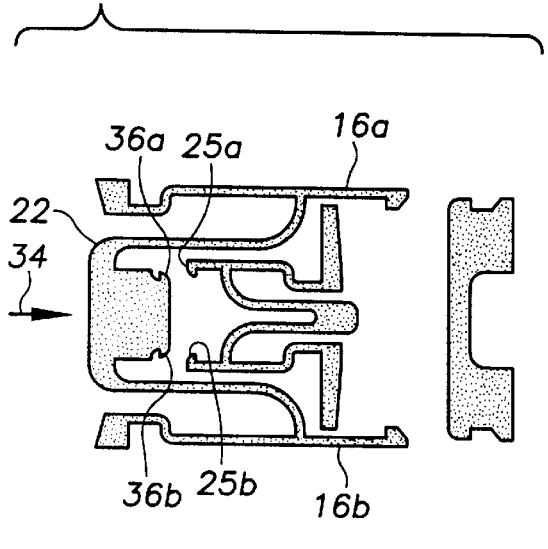
FIGS. 2A–D are top-down views of the fastener of the invention at four stages of fastening and release operations in accordance with the invention.
Figure 2B:
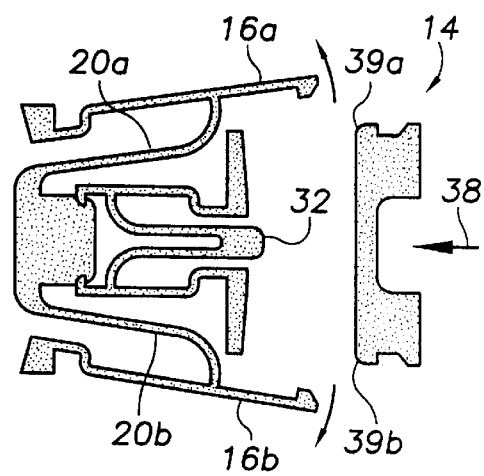

Turning also to FIG. 2A, in operation of the latching fastener of the invention an outer latch formed by the outer latching arms 16a, 16b, is first cocked by applying sufficient force 34 to the latch cocking element 22 to move the cocking element 22 into contact with the inner latching arm couples 25a, 25b. Inclined faces 36a, 36b, of the cocking element serve in the manner of a chamfer to cooperate with the inner latching arm couples 25a, 25b, in spreading apart the inner latching arms such that, as shown in FIG. 2B, the cocking element notches are moved to engage with the inner latching arm couples, thereby latching the cocking element into an inner latch formed of the two inner latching arms.

This activating of the cocking element by latching of the cocking element into the inner latch transmits force through the outer compliant beams 20a, 20b, to the outer latching arms 16a, 16b, causing them to retract, or spread apart, and produce a latching gap between them. At this point, force 38 can be applied to the free member 14 to guide the free member into the space between the spread-apart outer latching arms. The free member is here moved between the outer latching arms and pressed against the latch trigger 32 to activate the trigger and induce self-closing of the outer latching arms about the free member.

Figure 2C:
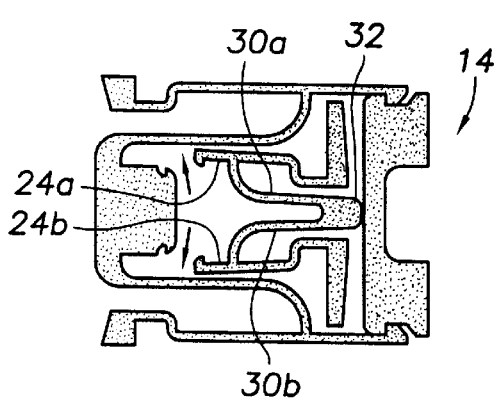

As shown in FIG. 2C, when the free member 14 is pressed against the trigger 32, force is transmitted from the trigger through the inner compliant beams 30a, 30b, to the inner latching arms 24a, 24b, whereby the inner latching arms are spread apart to release the latch cocking element from them. This deactivation of the cocking element by release of the cocking element in turn causes the outer latching arms to spring back to their normally-closed position, here closing to capture the free member 14 and complete the latching action. Preferably, the free member is provided with inclined faces 39a, 39b, (FIG. 2B) which act in the manner of chamfers to facilitate engagement of the free element notches with the latching arm couples as the latching arms close. Additionally, the rear walls 21a, 21b, of the notches are preferably inclined. Such an incline aids in a self-positioning action of the closing outer latch arms to position the free member in the latch. A vertical rear notch wall will not facilitate this self-positioning action.

Figure 2D:
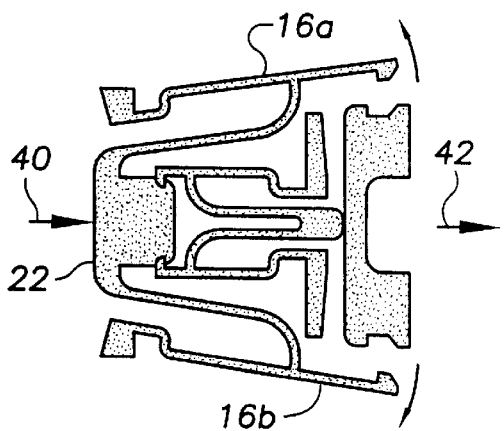

Recocking of the latch fastener, as shown in FIG. 2D, by applying force 40 to the cocking element 22, causes the outer latching arms 16a, 16b, to again spread apart, and thereby enables disengagement of the outer latching couples and withdrawal 42 of the free member 14 from the latch.

The dual latching mechanism employed by the fastener of the invention, in cooperation with the compliant connection between the dual latches, enables several performance advantages over more conventional latch fastener configurations. When the latch is first cocked by engaging the cocking element with the inner latch, the outer latching arms are thereafter automatically maintained in a spread-apart configuration until a free member is pressed against the latch trigger. No active control is required to maintain this pre-engagement configuration, rather, it is an automatic condition of the cocking element-inner latch engagement. This automatic cocking condition accommodates applications in which an unknown or long delay between the time of cocking and the time of engagement of the free member to be fastened can occur.

Spreading of the outer latching arms prior to fastening of the free member also accommodates inaccurate positioning of the free member with respect to the arms. The free member need only come at some point between the arms, but does not need to be precisely centered between the arms because it can effect closing of the arms by pressing against the fastener trigger at any point along its flat surface. Once closing of the arms is activated by pressing of the trigger, the arms self-position the free member due to engagement of the arm couples and the free member notches, as explained earlier. As a result, the fastener acts to accurately position a free member that in some applications may be rather inaccurately positioned prior to fastening.

When the cocking element is engaged with the inner latch prior to fastening of the free member, the fastener stores an amount of potential energy corresponding to the work required for this engagement. Upon triggering of the fastener by pressing the free member against the trigger, this potential energy is released as kinetic energy during engagement of the free member by the outer latch. This potential energy storage and release mechanism enables design of a fastener having desired, prespecified trigger and latching forces. Specifically, for the geometry shown, latch dimensions and a structural material can be selected to result in a latch having desired operational force requirements. In one preferable latch configuration, the dimensions and material are selected such that during latching the release of potential energy results in an actual clamping force exerted by the outer latching arms that is much greater than the force required to trigger the fastener, thereby providing an effective amplification of force applied to the fastener.

The fastener trigger mechanism also provides a positive-action configuration for ensuring and controlling full closure of the fastener. One can be assured that closure will not occur until the trigger is pressed, even if the free member is located somewhere between the outer latching arms, and once the trigger is pressed, complete closure is confirmed by the engagement of the outer latching arm couples with the free member notches. Applications for which fastener closure timing and completeness are critical are thus well-addressed by the fastener.

While conventional fasteners often provide some positive-action closure mechanism, the fastener of the invention additionally provides a positive-action release mechanism, which elegantly is furnished by engagement of the cocking element with the inner latch. Specifically, in a preferred outer latch design, the outer latching arm couples are not fully disengaged from the free member notches until the cocking element is latched in the inner latch. With this configuration, one can be assured that full release of a fastened free member can not be initiated until the cocking element is pressed and further that complete release will only be possible after the cocking element is engaged with the inner latch. As with the positive-action closure, this positive-action release enables control of timing and completeness for critical applications. As can be recognized, however, this positive-action release mechanism is directly dependent on the latch design, and particularly the outer compliant beams' design, and is not required by the invention.

The fastener of the invention, whether configured in the embodiment described above or other embodiments such as those to be later presented, can be employed in a wide range of fastening applications and is not restricted to any particular operational size. For example, the fastener can be configured as a seat belt fastener; an appliance plug; a sliding window or shutter fastener and lock; closures for luggage, backpacks, purses, and other gear; connectors for detachable straps on portable camping or other equipment; ribbon connectors for computers and other electronics; electromechanical fasteners for connecting printed circuit boards together or in, e.g., a computer chassis; and in general, any fastener application in which the proximal end of each of the fastening and cocking latch arms, e.g., the outer and inner latching arms described above, can be fixed with respect to each other.

For a given application, the fastener is preferably sized to accommodate the mode of manipulation corresponding to the application, as well as being sized to provide desired levels of cocking, engagement, and release forces, as discussed earlier, and to withstand the forces expected to be externally applied during use. Furthermore, for a given application, the inner and outer compliant arms are preferably specifically sized to cause the outer latch arms to spread apart a distance commensurate with the expected free member width and relative position tolerance for the application, and to ensure full release of the free member. Similarly, the compliant beams are preferably sized such that the inner latch arms are spread apart a distance that accommodates insertion and release of a cocking element of a desired width.

Considering the planar fastener embodiment just described, the fastener's overall configuration is preferably a relatively thin structure resulting in a high cross-sectional aspect ratio. This aspect ratio is desirable to minimize out-of-plane deflections of the inner and outer latching arms as they open and close. The latching arm anchors are preferably thick enough to withstand bending forces as the arms open and close.

As can be recognized, various features of the fastener can be modified to optimally address specific applications. For example, the inclined leading faces of the free member and cocking element can be rounded or otherwise optimized in a geometry other than that shown in the figures, for a specific application. The tightness of engagement fit between the latching arm couples and corresponding free member or cocking element notches can also be tailored; here the depth of the notch as well as the geometries of the rear notch wall and leading inclined faces of the latching arm couples can be optimized for a desired engagement fit.

To facilitate central positioning of the free member between the outer latching arms, a V-shaped groove can be provided in the central region of the free element flat surface to cooperate with the fastener trigger in relative positioning of the free member. The inner and outer latching arm anchors can be of any suitable dimension that provides secure connection between the fastener and an underlying substrate, and can be integral to the substrate, integral to the fastener, or can be a separate layer. Preferably, the proximal end of the cocking element is sized to enable force application to be applied to the element, either manually or with a manipulator, without undue alignment. The trigger element, in contrast, need only be of an appropriate size that accommodates the adjacent inner latching arm anchors.

Referring also back to FIG. 1, the distance, B, between the inner latching arm couples 25a, 25b, and the latch cocking element can be selected to impact the extent to which the outer latching arms are spread open as the cocking element notches engage the couples. A larger separation distance, B, results in a correspondingly larger extent of outer latching arm spreading. Also as shown in FIG. 1, the distance, F, between the outer latching arm couples 17a, 17b, and the edge of the trigger 32 can be selected to impact the tightness of fit of the free member against the trigger when the free member is fully engaged with the outer latching arm couples. For a given free member size, a larger separation distance, F, results in a correspondingly more loose latch fit. As can be recognized, both the extent of outer latching arm spreading and the looseness of the latch fit are preferably selected based on considerations for a given fastener application.

The fastener can be manufactured out of injection molded or extruded plastic, bonded or welded metal, or other suitable material for a given application. Preferably, the selected material is strong enough to resist yielding during fastener operation. The location and magnitude of stresses generated during fastener operation can be estimated by analytical or numerical methods such as finite element analysis to predict the operational stresses; preferably, the characteristic yield stress of the selected material is above the maximum stress generated during operation.

In other material considerations, the selected material is preferably selected to exhibit the compliance required of the inner and outer compliant arms for effecting spreading of the inner and outer latching arms to an extent commensurate with the selected dimensions of the free member and cocking element, and to provide a desired operational force characteristic, as explained previously with regard to the latch's energy storage and release capabilities. For a selected latch size and compliant beam curvature, a desired operational force profile is preferably specified such that a corresponding material compliance can be calculated to ascertain specifically suitable materials and their dimensions. Material characteristics such as Young' Modulus and Poisson's ratio are here preferably considered to ensure that a desired degree of compliance is indeed achieved.

The planar fastener embodiment provided by the invention is particularly well-suited to applications in the microregime that are addressed by structures fabricated by micromachining of microelectronic materials such as silicon. Silicon micromachining encompasses a wide range of generally planar processes for fabricating silicon-based micromechanical devices that enable on a microscale functions that are conventionally associated with macro-sized devices. The planar configuration of the fastener of the invention lends itself well to such micromachining processes, and silicon is a microelectronic material characterized by both the compliance and strength required by the fastener.

In general, a microfastener in accordance with the invention is configured as a planar silicon, polysilicon, or other microelectronic material structure that is suspended over the surface of or a cavity in a substrate such as a semiconductor wafer, e.g., a silicon wafer. Of particular importance to this embodiment is the nondestructive release mechanism provided by the microfastener; this enables a wide range of micro-connection applications where it is desirable that the fastener connection mechanism be reusable, and accordingly enables temporal and repeated micro-connection scenarios.

In one example microfastener in accordance with the invention, single crystal bulk silicon is processed, in a fabrication sequence outlined below, to produce a silicon microfastener. The fastener is here a thickness of, e.g., about 10 $\mu$m, with the inner latching arms and compliant beams of a width of, e.g., about 5 $\mu$m and having a couple width of about 5 $\mu$m, and the outer latching arms and compliant beams of a width of, e.g., about 8 $\mu$m and a couple width of about 10 $\mu$m. The inner latching arms are about 110 $\mu$m in length and the outer latching arms are about 250 $\mu$m in length. The compliant arms are of lengths corresponding to the respective latching arm lengths. With this latch geometry, a latch cocking element having a width of about 60 $\mu$m, and a free member having a width of between about 160 $\mu$m–175 $\mu$m are accommodated, and the notches of the free member to be fastened and the fastener cocking element preferably correspond directly to the width of the corresponding arms' couples.

Numerical analysis of the fastening motion of this structure indicates the following, with the assumption that stress of the structure is plane stress, i.e., that no vertical variations in stress occur; this is a good assumption for the micro-sized fastener. For a compressive force of about 2000 $\mu$N exerted at the left end of the cocking element and pointing to the right as the cocking element is engaged with the inner latching arms, each outer latching arm opens about 60 $\mu$m from its normally-closed position. As the outer latching arms are spread open, the resulting application of an extensile force of about 1000 $\mu$N exerted at each of the inner latching arms' couples and pointing to the left, generates a counter-clockwise bending moment that causes the inner latch to close rather than open, due to a force balance mechanism produced by the curves 33a, 33b, (FIG. 1) of the inner latching arms. Then, when a compressive force of about 400 $\mu$N pointing to the left is exerted at the right end of the trigger element as the trigger is pressed by the free member, the combination of this compressive force and the extensile force causes each of the inner latching arms to open about 6 $\mu$m from its closed position. This analysis indicates that the structure can indeed successfully capture and release a latching member in its inner and outer latches. The analysis also indicates that the maximum stress generated during fastener operation is about 2.5 GPa and that this stress level occurs in the curved sections 35a, 35b, (FIG. 1) of the outer latching arms. This level of stress is only about 35% of the yield stress characteristic of single crystal silicon, and thus is acceptable for the microfastener embodiment.

Figure 3A:
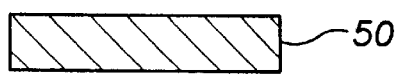
FIGS. 3A–D are cross-sectional views of a first fabrication process for producing a microfastener in accordance with the invention.
Figure 3B:
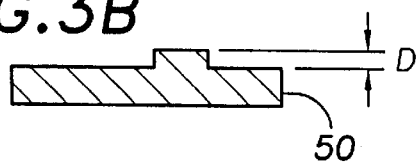

Many micromachining processes can be employed for fabricating the microfastener. Referring to FIGS. 3A–B, in a first example process in accordance with the invention, a silicon wafer 50 is lithographically patterned, using standard techniques, to define the fastener anchors. The anchor pattern is etched into the wafer using, e.g., an $SF_6$-based plasma etch chemistry, a wet etch such as KOH, an electrochemical etching process, or other suitable etching configuration. The depth, D, of the etch defines the height of the anchors which act to suspend the microfastener over the resulting cavity. In one suitable configuration, the cavity depth is between about 5–10 $\mu$m.

Figure 3C:
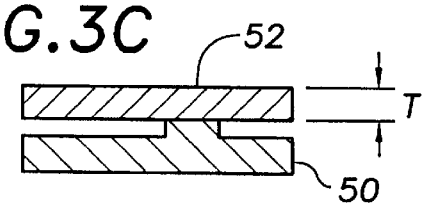

Turning to FIG. 3C, a second wafer 52 is then bonded to the first wafer 50 using a standard fusion bonding process, and the wafer is thinned to a desired thickness for the microfastener. This thinning process can be accomplished by, e.g., chemo-mechanical polishing, by etching through the thickness to an etch stop dopant layer previously implanted or diffused, or by other suitable process. For the example structure analyzed above, the second wafer is thinned to produce a layer of a thickness, T, that is about 10 $\mu$m.

Figure 3D:
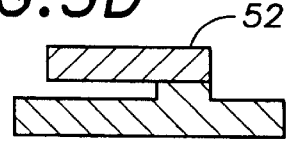

In a final step, as shown in FIG. 3D, the thinned layer is lithographically patterned to define the latching arms, compliant beams, cocking element, and trigger, and is then etched in a manner similar to that of the anchor etch. With this etch, the microfastener is fully fabricated.

As can be recognized, for some applications it may not be preferable to employ for the microfastener mechanical elements a layer that results from extensive thinning by mechanical or chemical etching of a thicker wafer. Such thinning processes can introduce defects and generate internal regions of stress that could adversely affect the reliability and robustness of the microfastener.

Figure 4A:
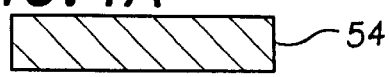
FIGS. 4A–I are cross-sectional views of a second fabrication process for producing a microfastener in accordance with the invention.
Figure 4B:
Figure 4C:
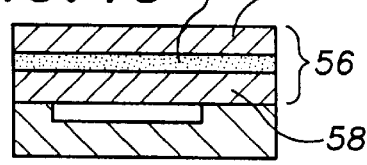

In a second example microfastener fabrication process in accordance with the invention, no wafer thinning is required. Turning to FIGS. 4A–B, in this process a first wafer 54 is lithographically patterned and etched, e.g., in an $SF_6$ plasma, to define the microfastener anchors and underlying cavity of depth D. Then, as shown in FIG. 4C, a silicon-silicon dioxide-silicon (SOS) composite wafer 56 is fusion bonded to the first wafer 54 using a standard wafer bonding process. Such a SOS wafer is commercially available and is here preferably selected such that the lower silicon layer 58, over which a silicon dioxide layer 60 and second silicon layer 62 are provided, is of the desired microfastener thickness, T.

Figure 4D:
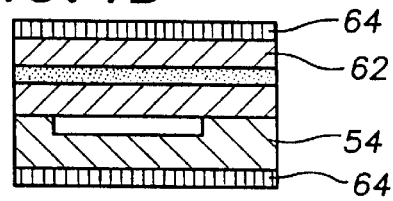

Use of a commercial silicon-insulator-silicon wafer enables fabrication of the microfastener with standard microfabrication techniques that are commonly undertaken as batch processes in production of microelectronics, and further eliminates the use of a thinned material for the microfastener's mechanical components. In a next process step, shown in FIG. 4D, a layer of silicon nitride 64, preferably silicon-rich, low stress silicon nitride, is deposited on both the upper silicon layer 62 of the SOS wafer 56 and the first wafer 54. Conventional low pressure chemical vapor deposition techniques can be employed to produce this nitride layer.

Figure 4E:
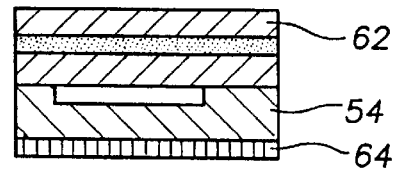
Figure 4F:
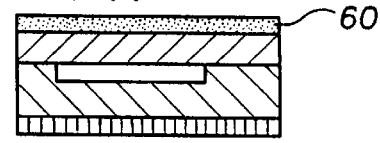
Figure 4G:
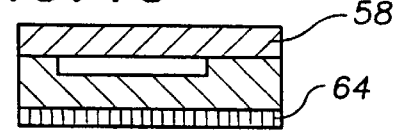
Figure 4H:
Figure 4I:
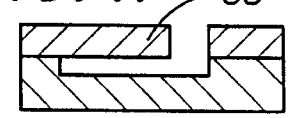

Then the upper silicon layer 62 of the SOS wafer 56 is exposed by etching the silicon nitride layer 64 from its surface, as shown in FIG. 4E. This upper silicon layer 62 is then itself removed from the underlying silicon dioxide layer 60, as shown in FIG. 4F, by, e.g., wet KOH etching of that silicon layer. Next the intermediate silicon dioxide layer is removed by, e.g., exposure of the wafer to a buffered oxide etch, the results of which are shown in FIG. 4G. The lower silicon nitride layer 64 is then removed from the first wafer 54, as shown in FIG. 4H, by, e.g., wet etching. Finally, the lower silicon layer 58 is lithographically patterned with the microfastener geometry and etched in, e.g., an $SF_6$-based plasma chemistry to produce, as shown in FIG. 4I, the patterned microfastener. This alternative fabrication process, while requiring more process steps than the first sequence, enables a more standardized process that does not require thinning of a wafer to produce a desired microfastener thickness.

As can be recognized, other fabrication processes can be employed to produce a microfastener. For example, standard surface micromachining techniques employing a sacrificial silicon dioxide layer and a deposited, patterned polysilicon layer that forms the microfastener itself can be used for applications for which polysilicon provides adequate mechanical integrity. Materials other than polysilicon, e.g., silicon nitride or other suitable material, can also be employed in formation of the microfastener, with the requirements for yield strength and compliance being considered.

The microfastener can be employed in a wide range of micro-scale applications and is particularly well-suited to planar connection configurations. Given that only standard microelectronic materials are employed to fabricate the microfastener, electronic circuitry can be fabricated on the same substrate to which the microfastener is anchored, enabling integration of the mechanical capabilities of the fastener with electrical circuit configurations. For example, the microfastener can be integrated with an electrical circuit or system to provide a micro-circuit breaker configuration for the circuit or system.

The microfastener can also be employed as a mechanical, electromechanical, or opto-mechanical connector for micro-scale applications. As a mechanical connector, the microfastener can temporarily or permanently connect two micromechanical or microelectromechanical structures together, e.g., two structures that are components of a larger micromechanical system such as a microsensor or microactuator system. The microfastener thus enables linking of movable micro-scale components together. At this size regime, a probe tip can be employed to effect the latch fastener cocking and release functions.

The microfastener can also be employed as the end-effector of a macro-sized micromanipulator. In this application, the microfastener can capture micro-scale componentry that is to be, e.g., positioned, connected, or relocated; once the intended operations on the captured componentry are completed, the microfastener can release the componentry at its intended location. The microfastener thereby provides an elegant manipulation bridge between the macro and micro regimes.

Figure 5B:
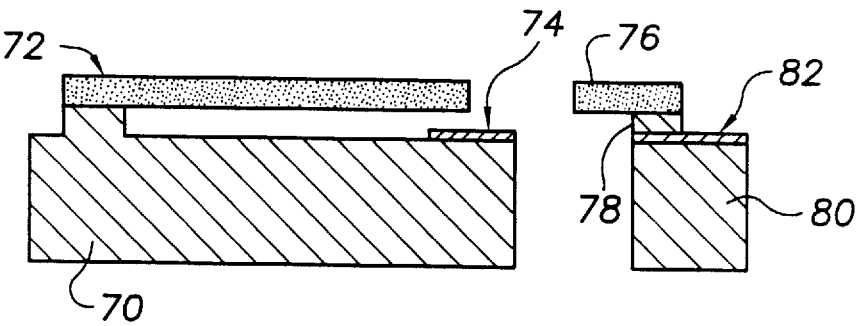

Turning to an example electromechanical application of the microfastener in accordance with the invention, as shown in the top-down view of FIG. 5A and the side view of FIG. 5B, the substrate 70 to which the microfastener 72 is anchored includes electrical contacts 74 that are connected to, e.g., other componentry (not shown) on the substrate. The micro-free member 76 to be engaged by the fastener is formed on an anchor plate 78, as shown in FIG. 5B, located on a second substrate 80. Electrical contacts 82 are located on the anchor plate 78 under the micro-free member 76 and extend out from the anchor plate to other componentry (not shown). Preferably, the electrical contact pattern 74 on the microfastener substrate 70 corresponds to that on the second substrate 80.

When the micro-free member is engaged with the fastener outer latch, the two sets of electrical contacts are put into good mechanical contact whereby electrical contact between the two substrates is provided. Note that in this application, it may in some cases be preferable to provide on the micro-free member 76 a central V-shaped groove 84 for ensuring precise positioning of the micro-free member 76 with the microfastener trigger.

Figure 6A:
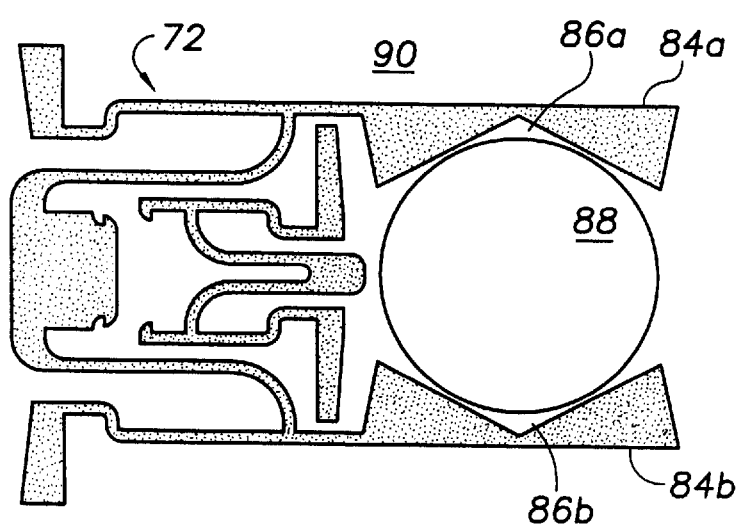
FIGS. 6A–B are top-down and side views, respectively, of a microfastener in accordance with the invention adapted as an electro-optic micro-connector.
Figure 6B:
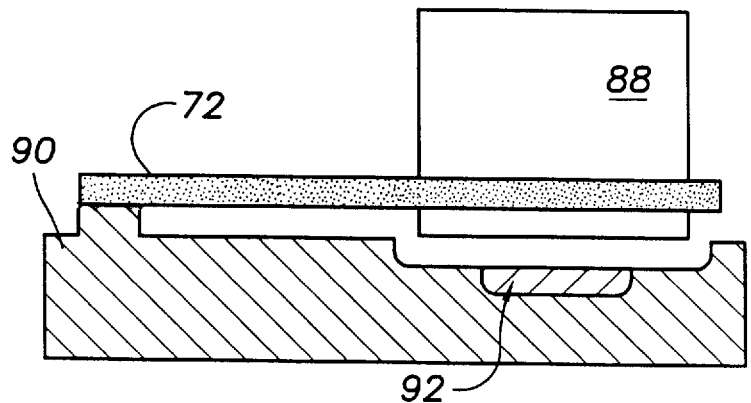

Referring now to FIGS. 6A–B, in an example opto-mechanical application of the microfastener in accordance with the invention, the microfastener is here modified such that the outer latching arms 84a, 84b, provide extended V-shaped couples 86a, 86b, that enable latching of an optical fiber 88 perpendicular to the plane of the microfastener. In this application, the substrate 90 to which the microfastener is anchored can advantageously support an optical device 92, e.g., a surface-emitting LED or PIN diode, located in the substrate under the location of the outer latching arms, such that the optical fiber is aligned with the optical device when latched in the microfastener.

In this application, the thickness of the microfastener can be adjusted to provide adequate support for the perpendicular optical fiber, or the microfastener can be relied upon only as an alignment and positioning tool, with another support or an attachment mechanism provided for long term positioning of the optical fiber. This microfastener application illustrates its ability to interface with structures out of the plane of its operational movement.

As explained at the beginning of the discussion, a wide range of design adaptations are contemplated by the invention for enabling the cocking and triggering of latching arms in various configurations. In a first example of a design adaptation, shown in FIGS. 7A–7C, fastening latch arms 16a, 16b, are again provided, but in place of the single inner latch of the embodiment of FIGS. 1–2, dual pairs of cocking latch arms 71a, 71b, are here provided. The first pair 71a of cocking latch arms, located in a plane above that of the fastening latch arms 16a, 16b, has a corresponding cocking element 73a and trigger element 75, connected by a trigger beam pair, all co-planar with the cocking latch arms 71a. Similarly, the second pair 71b of cocking latch arms, located in a plane below that of the fastening latch arms 16a, 16b, has a corresponding cocking element 73b and trigger element 75b, connected by a trigger beam pair, all co-planar with the cocking latch arms 71b.

As shown in FIG. 7C, the upper pair 71a of cocking latch arms is provided with anchors 77a, 77b, that are secured to a wall of a fastener housing 81, here shown to be a rectangular housing. The lower pair 71b of cocking latch arms is provided with anchors 79a, 79b, that are secured to an opposing wall of the fastener housing. The anchors 18a, 18b, of the fastening latch arms 16a, 16b, are connected to side walls of the fastener housing. The upper and lower cocking mechanisms are each connected to compliant fastener beams 20a, 20b, associated with the fastening latch arms, by vertical struts, with two struts 83a, 83b, connected between the upper cocking element 73a and the fastener beams 20a, 20b, and two struts 85a, 85b connected between the lower cocking element 75a and the fastener beams 20a, 20b.

With this configuration, the six anchor points associated with the two fastening latch arms and the four cocking latch arms are fixed with respect to each other. While a rectangular housing is here shown for this anchoring, it is to understood that another suitable housing geometry, e.g., a circular geometry, can also be employed. The housing preferably is sized to accommodate full extension of the fastening latch arms when they are triggered to separate, or alternatively, slits are provided in the housing for this accommodation. Accordingly, the cross section of a free member to be latched in the fastener preferably corresponds to the cross section of the housing, and preferably includes notches.

In this multi-plane fastener configuration, the cocking latch arm pairs are not restricted to move in the plane of the fastening latch arm pair, and thus, the cocking latch arm pairs can be of the same size, or even larger than, the fastening latch arm pair. Whatever their size, the cocking latch arm pairs and their associated trigger beam pairs are preferably more compliant than the fastening latch arms and fastener beams to enable a fastening latch arm grasping action characterized by a grasping force that is larger than the corresponding triggering force required to produce the grasping, in the manner described earlier for enabling effective amplification of applied triggering force.

This multi-plane fastener configuration defines a gap 90, in FIG. 7C, between the upper and lower cocking and triggering mechanisms. This gap enables insertion of a structure such as a hollow structure, e.g., a pipe, to be fastened into the gap between the upper and lower mechanisms and accommodates flow of, e.g., fluid, through the pipe as it is held by the fastener. For example, a circumferentially notched pipe can be fastened to another pipe, or two optical fibers can be aligned in end-to-end fashion by way of the fastener, here functioning as a connector. In an alternative configuration, the gap 91 between the upper and lower mechanisms can be eliminated if such a gap is not needed for a given application.

The fastening latch arms cannot separate to effect fastening unless both the upper and lower cocking mechanisms are activated. This is a binary latch switching action that can be characterized as an ANDing of the two cocking mechanism activations, and accordingly provides binary switch control. Additional numbers of parallel cocking and triggering mechanisms can accordingly be included to enable binary ANDing switch control having a larger number of control input points.

Turning to another fastener embodiment in accordance with the invention, as shown in FIGS. 8A–C, the fastener here employs co-planar fastening latch arms 16a, 16b, that are orthogonal with a cocking element 93, cocking latch arms 94a, 94b, trigger beams 96a, 96b, and a trigger element 98, these elements together being coplanar. In this embodiment, the cocking latch arms 94a, 94b, are anchored at anchor points 100a, 100b, to the inner wall of a fastener housing, e.g., circular housing 102. Similarly, the fastening latch arms 16a, 16b, are anchored to the housing 102 by anchors 18a, 18b. The cocking element 92 here is connected to fastener beams 20a, 20b, by a connector 104 that orthogonally connects the cocking element to the beams.

This configuration enables anchoring of the fastening and cocking latch arms with respect to each other while maintaining the fastening latch arms in a plane perpendicular to that of the cocking and triggering mechanisms. As with the multi-planar embodiment just described, the cocking latch arms here can be of the same size as the fastening latch arms, as represented in FIG. 8C, because the cocking latch arms are not constrained to the fastening latch arm plane, but the cocking and triggering mechanisms are preferably of a compliance that enables the production of a large grasp force with a relatively smaller triggering force. Also as in the previous embodiment, the housing preferably is of a size that accommodates full separation of the fastening latch arms, or alternatively, includes slits that enable the separation.

In an adaptation of this configuration, multiple fastener latches can be configured around the circumference of the housing. For example, three latches, separated from each other by 120°, can be configured in the housing. As can be recognized, angular positioning of the cocking and trigger mechanisms with respect to corresponding fastening latch arms is in this case required.

From the foregoing, it is apparent that the fastener configurations provided by the invention and described above enable a wide range of fastening applications and do so with a positive-action engagement and release mechanism that accommodates imprecise latch positioning and low engagement force based on an elegant design of a compliant, dual latching configuration. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A latching fastener comprising:
   two flexible fastening latch arms each fixed at a proximal end of each respective fastening latch arm and having a free distal end, the two flexible fastening latch arms located relative to each other to cooperate in grasping a structure between the distal ends of the fastening latch arms;
   fastener cocking means connected to the fastening latch arms for retracting the distal ends of the fastening latch arms when the cocking means is activated, to thereby produce a latching gap between the distal ends of the fastening latch arms; and
   trigger means located between the fastening latch arms such that a structure to be grasped that is guided into the latching gap can activate the trigger means, for deactivating the cocking means, whereby the distal ends of the fastening latch arms close to grasp the structure between the fastening latch arms and latch the structure to the fastener.

2. The latching fastener of claim 1 wherein each fastening latch arm distal end comprises a latch couple to cooperate with a corresponding notch in the structure to be grasped as the fastening latch arms close to grasp the structure.

3. The latching fastener of claim 1 wherein the cocking means is connected at a point along each fastening latch arm by a corresponding compliant fastener beam.

4. The latching fastener of claim 3 wherein the cocking means comprises a cocking element and two cocking latch arms each fixed at a proximal end with respect to the fixed proximal end of each fastening latch arm; and each having a free distal end, the two cocking latch arms located relative to each other to cooperate in latching the cocking element between the distal ends of the cocking latch arms when the cocking element is pressed between the cocking latch arms, each compliant fastener beam connecting the cocking element to a corresponding fastening latch arm for retracting the fastening latch arms as the cocking element is latched between the cocking latch arms.

5. The latching fastener of claim 4 wherein each cocking latch arm distal end comprises a latch couple for cooperating with a corresponding notch in the cocking element as the cocking latch arms grasp the cocking element.

6. The latching fastener of claim 4 wherein the trigger means comprises a trigger element connected to each of the cocking latch arms by a corresponding compliant trigger beam for retracting the cocking latch arms to unlatch the cocking element from the cocking latch arms when the trigger element is pressed, causing the fastening latch arms to close.

7. The latching fastener of claim 6 wherein the fastening and cocking latch arms, the compliant fastener and trigger beams, the trigger element, and the cocking element all comprise a compliant material.

8. The latching fastener of claim 7 wherein the fastening and cocking latch arms, the compliant fastener and trigger beams, the trigger element, and the cocking element all comprise plastic.

9. The latching fastener of claim 7 wherein the fastening and cocking latch arms, the compliant fastener and trigger beams, the trigger element, and the cocking element all comprise silicon.

10. The latching fastener of claim 9 wherein the fastening and cocking latch arms, the compliant fastener and trigger beams, the trigger element, and the cocking element all comprise single crystal silicon.

11. The latching fastener of claim 9 wherein the fastening and cocking latch arms, the compliant fastener and trigger beams, the trigger element, and the cocking element are microfabricated arms, beams, and elements suspended over a semiconductor substrate.

12. The latching fastener of claim 11 wherein the semiconductor substrate comprises an electronic circuit located on the substrate.

13. The latching fastener of claim 6 wherein the fastening latch arms are co-planar, and wherein the cocking latch arms, the cocking element, the compliant trigger beams, and the trigger element are together co-planar in a plane parallel to a grasping plane defined by the fastening latch arms.

14. The latching fastener of claim 6 wherein the fastening latch arms are co-planar, and wherein the cocking latch arms, the cocking element, the compliant trigger beams, and the trigger element are together co-planar with a grasping plane defined by the fastening latch arms.

15. The latching fastener of claim 6 wherein the fastening latch arms are co-planar, and wherein the cocking latch arms, the cocking element, the compliant trigger beams, and the trigger element are together co-planar in a plane distinct from a grasping plane defined by the fastening latch arms.

16. The latching fastener of claim 15 wherein the cocking latch arms, the cocking element, the compliant trigger beams, and the trigger element are together co-planar in a plane orthogonal to a grasping plane defined by the fastening latch arms.

* * * * *